US012593709B2

(12) United States Patent
Moon et al.

(10) Patent No.: US 12,593,709 B2
(45) Date of Patent: Mar. 31, 2026

(54) SUBSTRATE(S) FOR AN INTEGRATED CIRCUIT (IC) PACKAGE EMPLOYING A CORE LAYER AND AN ADJACENT INSULATION LAYER(S) WITH AN EMBEDDED METAL STRUCTURE(S) POSITIONED FROM THE CORE LAYER

(71) Applicant: QUALCOMM Incorporated, San Diego, CA (US)

(72) Inventors: Hi Moon, Suwon-si (KR); Joan Rey Villarba Buot, Escondido, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 355 days.

(21) Appl. No.: 18/451,354

(22) Filed: Aug. 17, 2023

(65) Prior Publication Data

US 2025/0062203 A1 Feb. 20, 2025

(51) Int. Cl.
| | |
|---|---|
| *H10W 70/685* | (2026.01) |
| *H10W 70/05* | (2026.01) |
| *H10W 70/692* | (2026.01) |
| *H10W 70/695* | (2026.01) |

(52) U.S. Cl.
CPC ......... *H10W 70/685* (2026.01); *H10W 70/05* (2026.01); *H10W 70/692* (2026.01); *H10W 70/695* (2026.01)

(58) Field of Classification Search
CPC ........... H01L 23/49822; H01L 21/4857; H01L 23/145; H01L 23/15; H10W 70/685; H10W 70/05; H10W 70/692; H10W 70/695
See application file for complete search history.

(56) References Cited

U.S. PATENT DOCUMENTS

| | | | |
|---|---|---|---|
| 2021/0287976 A1* | 9/2021 | Buot | H01L 21/486 |
| 2022/0068780 A1 | 3/2022 | Kang et al. | |
| 2023/0163112 A1* | 5/2023 | We | H01L 23/49822 |
| | | | 257/774 |

FOREIGN PATENT DOCUMENTS

| | | | | |
|---|---|---|---|---|
| CN | 114038828 A | * | 2/2022 | ......... H01L 21/4857 |
| KR | 20230018242 A | * | 2/2023 | ....... H01L 23/49827 |
| WO | 2023008966 A1 | | 2/2023 | |

OTHER PUBLICATIONS

International Search Report and Written Opinion for International Patent Application No. PCT/US2024/040920, mailed Nov. 29, 2024, 15 pages.

* cited by examiner

*Primary Examiner* — John P. Dulka
(74) *Attorney, Agent, or Firm* — Withrow & Terranova, PLLC

(57) ABSTRACT

A substrate includes a core layer and one or more metallization layers. The core layer provides stabilization to the substrate to reduce or avoid warpage. The core layer may include a glass material weaved throughout the core to provide stabilization and avoid warpage. A metallization layer adjacent to the core layer in the substate includes an insulation layer and the embedded metal structure(s) that is positioned from the core layer. The thickness of the insulation layer is greater than the embedded metal structure so that a surface of the embedded metal structure is positioned at least at a length from the surface of the glass material. This can avoid or reduce the risk of the embedded metal structure electrically shorting to another metal structure in the substrate through the core layer.

18 Claims, 15 Drawing Sheets

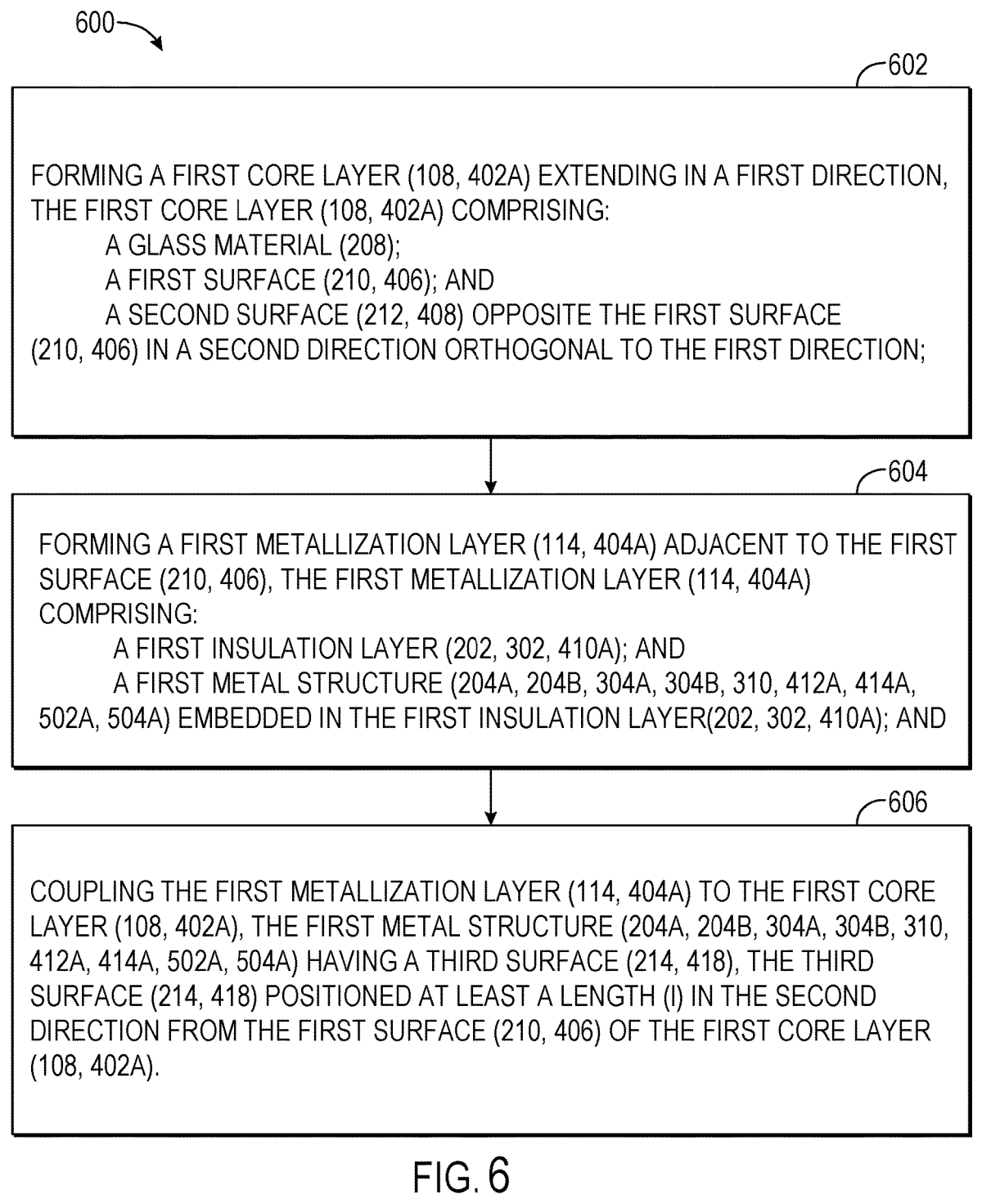

600

602

FORMING A FIRST CORE LAYER (108, 402A) EXTENDING IN A FIRST DIRECTION, THE FIRST CORE LAYER (108, 402A) COMPRISING:
      A GLASS MATERIAL (208);
      A FIRST SURFACE (210, 406); AND
      A SECOND SURFACE (212, 408) OPPOSITE THE FIRST SURFACE (210, 406) IN A SECOND DIRECTION ORTHOGONAL TO THE FIRST DIRECTION;

604

FORMING A FIRST METALLIZATION LAYER (114, 404A) ADJACENT TO THE FIRST SURFACE (210, 406), THE FIRST METALLIZATION LAYER (114, 404A) COMPRISING:
      A FIRST INSULATION LAYER (202, 302, 410A); AND
      A FIRST METAL STRUCTURE (204A, 204B, 304A, 304B, 310, 412A, 414A, 502A, 504A) EMBEDDED IN THE FIRST INSULATION LAYER(202, 302, 410A); AND

606

COUPLING THE FIRST METALLIZATION LAYER (114, 404A) TO THE FIRST CORE LAYER (108, 402A), THE FIRST METAL STRUCTURE (204A, 204B, 304A, 304B, 310, 412A, 414A, 502A, 504A) HAVING A THIRD SURFACE (214, 418), THE THIRD SURFACE (214, 418) POSITIONED AT LEAST A LENGTH (l) IN THE SECOND DIRECTION FROM THE FIRST SURFACE (210, 406) OF THE FIRST CORE LAYER (108, 402A).

FIG.6

PROVIDING TWO CORE LAYERS (108) (E.G., PPG MATERIAL)

702

LAMINATING INSULATION LAYERS (202) AND (216) TO THE CORE LAYER (108). ALSO, APPLYING A METAL (CU) SEED LAYER (802) ON INSULATING LAYER (216) THROUGH AN ELECTROLESS CU PLATING PROCESS.

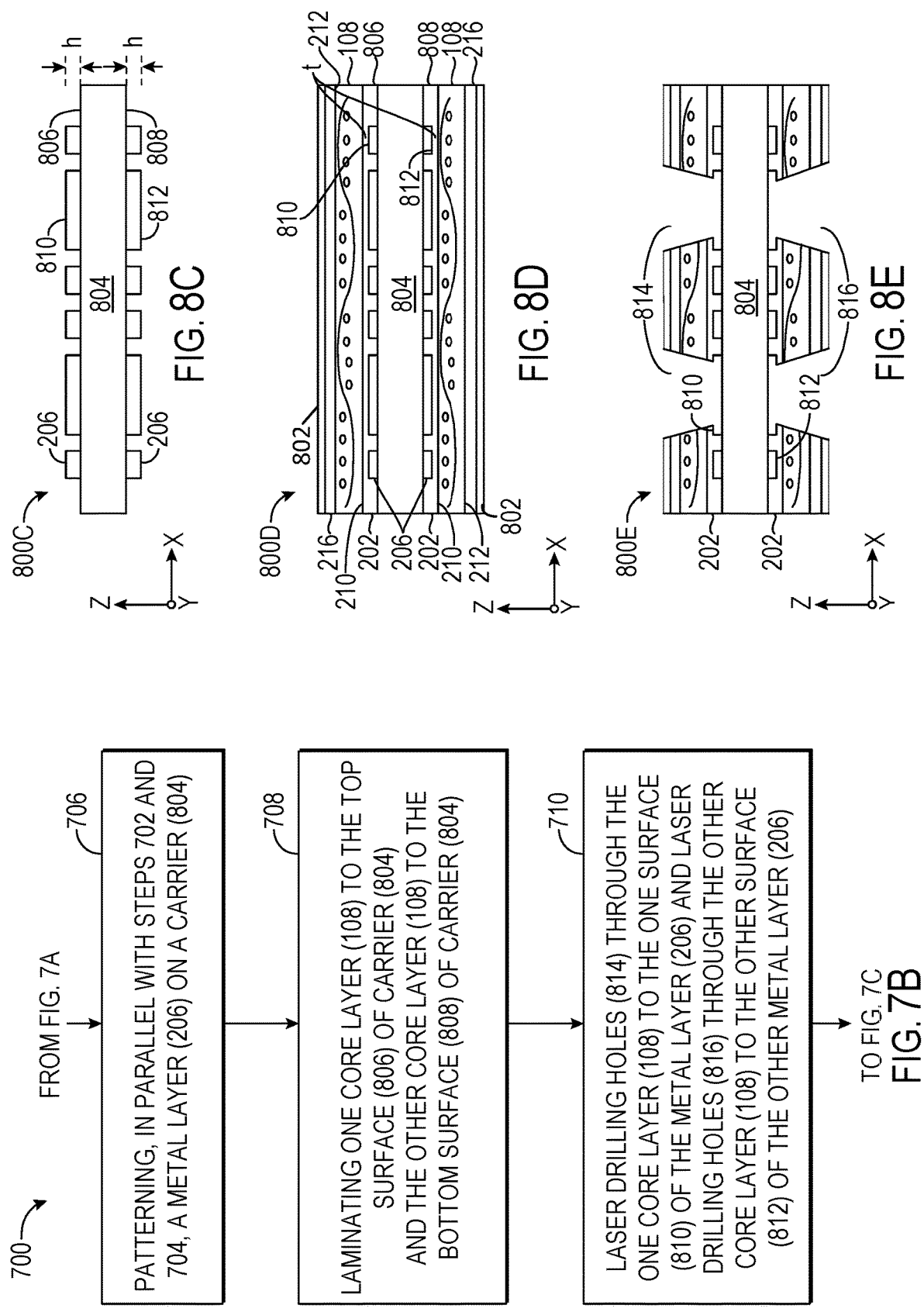

FROM FIG. 7A

706

PATTERNING, IN PARALLEL WITH STEPS 702 AND 704, A METAL LAYER (206) ON A CARRIER (804)

708

LAMINATING ONE CORE LAYER (108) TO THE TOP SURFACE (806) OF CARRIER (804) AND THE OTHER CORE LAYER (108) TO THE BOTTOM SURFACE (808) OF CARRIER (804)

710

LASER DRILLING HOLES (814) THROUGH THE ONE CORE LAYER (108) TO THE ONE SURFACE (810) OF THE METAL LAYER (206) AND LASER DRILLING HOLES (816) THROUGH THE OTHER CORE LAYER (108) TO THE OTHER SURFACE (812) OF THE OTHER METAL LAYER (206)

FROM FIG. 7B

PATTERNING METAL TO FILL HOLES (814, 816) AND FORM METAL VIAS (818, 820)

714

DETACHING EACH OF THE TWO INTERMEDIATE SUBSTRATES (822) FROM CARRIER (804)

716

LAMINATING INSULATION MATERIAL (213, 222) ON BOTH SIDES OF INTERMEDIATE SUBSTRATE (822) TO FORM SUBSTRATE (200)

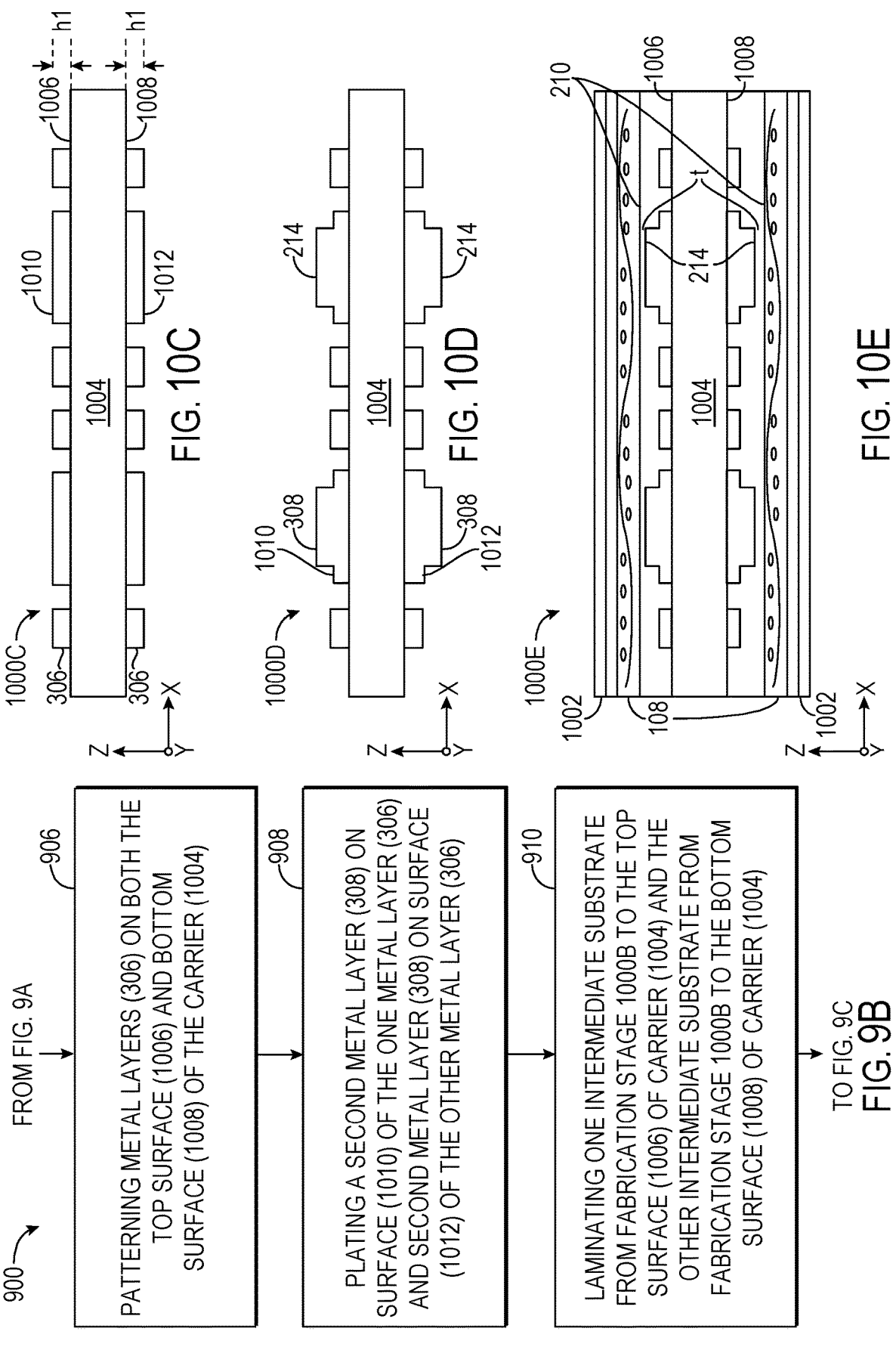

906
PATTERNING METAL LAYERS (306) ON BOTH THE TOP SURFACE (1006) AND BOTTOM SURFACE (1008) OF THE CARRIER (1004)

908
PLATING A SECOND METAL LAYER (308) ON SURFACE (1010) OF THE ONE METAL LAYER (306) AND SECOND METAL LAYER (308) ON SURFACE (1012) OF THE OTHER METAL LAYER (306)

910
LAMINATING ONE INTERMEDIATE SUBSTRATE FROM FABRICATION STAGE 1000B TO THE TOP SURFACE (1006) OF CARRIER (1004) AND THE OTHER INTERMEDIATE SUBSTRATE FROM FABRICATION STAGE 1000B TO THE BOTTOM SURFACE (1008) OF CARRIER (1004)

FROM FIG. 9A

FROM FIG. 9B

LASER DRILLING HOLES (1014) THROUGH THE ONE CORE LAYER (108) TO THE ONE SURFACE (214) OF THE METAL LAYER (308) AND LASER DRILLING HOLES (1016) THE OTHER CORE LAYER (108) TO THE OTHER SURFACE (214) OF THE OTHER METAL LAYER (308)

914

PATTERNING METAL TO FILL HOLES (1014) AND (1016) AND FORM METAL VIAS (1018) AND (1020)

916

DETACHING EACH OF THE TWO INTERMEDIATE SUBSTRATES (1022) FROM CARRIER (1004)

SUBSTRATE(S) FOR AN INTEGRATED CIRCUIT (IC) PACKAGE EMPLOYING A CORE LAYER AND AN ADJACENT INSULATION LAYER(S) WITH AN EMBEDDED METAL STRUCTURE(S) POSITIONED FROM THE CORE LAYER

BACKGROUND

I. Field of the Disclosure

The field of the disclosure relates to integrated circuit (IC) packages, and more particularly to design and manufacture of a substrate within an IC package to improve circuit reliability due to substrate thinning requirements.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a package substrate to provide physical support and an electrical interface to the die(s). The package substrate includes one or more metallization layers that include respective metal layers with metal interconnects (e.g., metal traces, metal lines) with vias coupling the metal interconnects together between adjacent metallization layers to provide electrical interfaces between the die(s). The die(s) is electrically interfaced to metal interconnects exposed in a top or outer metallization layer of the package substrate to electrically couple the die(s) to the metal interconnects of the package substrate. For example, the package substrate may include a laminate substrate or an embedded trace substrate (ETS) layer adjacent to and electrically coupled to a die to provide signal routing paths to the die. Metal interconnects in the outer metallization layer of the package substrate are coupled to other metal interconnects in other, lower metallization layers in the package substrate to provide signal routing paths to a coupled die. The term "adjacent" as used herein means spatially next to but not necessarily adjoining something as shown in the Figures unless specifically stated otherwise.

Some IC packages are known as "hybrid" IC packages, which include multiple die packages with respective dies for different purposes or applications. For example, a hybrid IC package may be an application die, such as a communications modem or processor (including a system). The hybrid IC package could also include, for example, one or more memory dies to provide memory to support data storage and access by the application die. Multiple dies could be disposed in a single die layer and disposed adjacent to each other in a horizontal direction on a package substrate in the IC package. The multiple dies could also be provided in their own respective die packages that are stacked on top of each other in a three-dimensional (3D) arrangement as an overall 3DIC package. A die in a die layer is typically encased in an epoxy molding compound (EMC) to protect the die. 3DIC packages may be desired to reduce the cross-sectional area of the package.

In a 3DIC package, a first, bottom die directly supported on a package substrate is electrically coupled through die interconnects to metallization layers of the package substrate. Metal interconnects (e.g., metal traces, metal lines) in the metallization layers of the package substrate provide signal routing paths to the bottom die. Other stacked dies that are not directly adjacent to the package substrate in the 3DIC package can be electrically coupled to the package substrate by wire bonds and/or an interposer substrate to provide die-to-die (D2D) connections between the multiple stacked dies. An interposer substrate is adjacent to and electrically coupled to a second, top die to provide signal routing paths between the top die and the package substrate for external and/or D2D connections. Similar to a package substrate, an interposer substrate includes one or more metallization layers each with a respective metal layer that includes metal interconnects (e.g., metal traces, metal lines) with vias coupling the metal interconnects together between adjacent metallization layers to provide signal routing paths between the multiple stacked dies through the package substrate. The top die routes electrical signals to metal interconnects exposed in a top, outer metallization layer of the interposer substrate to electrically couple the bottom die through the metal interconnects of the bottom, lower metallization layer of the interposer substrate, and vertical die interconnects and metal interconnects in the package substrate to provide signal routing paths to the bottom die.

SUMMARY

Aspects disclosed in the detailed description include a substrate for an integrated circuit (IC) package employing a core layer and an adjacent insulation layer with an embedded metal structure(s) positioned from the core layer to avoid electron migration. The substrate includes a core layer and one or more metallization layers. The core layer provides stabilization to the substrate to reduce or avoid warpage. For example, the core layer may include a glass material weaved throughout the core to provide stabilization to the core layer and avoid warpage. In exemplary aspects disclosed herein, a metallization layer adjacent to the core layer in the substate includes an insulation layer and the embedded metal structure(s) that is positioned from the core layer. The thickness of the insulation layer is greater than the embedded metal structure so that a surface of the embedded metal structure is positioned at least at a length (l) from the surface of the glass material. This can avoid or reduce the risk of the embedded metal structure electrically shorting to another metal structure in the substrate through the core layer.

Additionally, in other exemplary aspects, in reducing the thickness of the core layer to meet today's overall package height requirements, shorter vias are formed through the core layer of the substrate to couple the embedded metal structure. The vias provide a pass through electrical connection through the core layer to adjacent metallization layers. To advantageously achieve a reliable via connection of the resulting shorter via, the embedded metal structure in the metallization layer can include two stacked metal structures forming a post. The post enables a drilled via (which may be formed by a drilling and metal fill process) to terminate within the two stacked metal structures and provide greater surface area connecting the inside of the two stacked metal structures and the via.

In this regard, in one exemplary aspect, a substrate is disclosed. The substrate comprises a first core layer extending in a first direction. The first core layer comprises a glass material, a first surface, and a second surface opposite the first surface in a second direction orthogonal to the first direction. The substrate also comprises a first metallization layer adjacent to the first surface. The first metallization layer comprises a first insulation layer and a first metal structure embedded in the first insulation layer, the first metal structure having a third surface, the third surface positioned at least a length (l) in the second direction from the first surface of the first core layer to prevent electron migration through the glass material.

In another exemplary aspect, a method for fabricating a substrate is disclosed. The method comprises forming a first core layer extending in a first direction. The first core layer comprises a glass material, a first surface, and a second surface opposite the first surface in a second direction orthogonal to the first direction. The method further comprises forming a first metallization layer adjacent to the first surface. The first metallization layer comprises a first insulation layer and a first metal structure embedded in the first insulation layer. The method further comprises coupling the first metallization layer to the first core layer wherein the first metal structure has a third surface, the third surface positioned at least a length (l) in the second direction from the first surface of the first core layer to prevent electron migration through the glass material.

BRIEF DESCRIPTION OF THE DRAWINGS

FIG. 6 is a flowchart illustrating an exemplary fabrication process of fabricating a substrate for an IC package, wherein the substrate employs a core layer and an adjacent insulation layer with an embedded metal structure positioned from the core layer to avoid electron migration including, but not limited to, the substrates in FIGS. 2-5;

FIGS. 7A-7C is a flowchart illustrating another exemplary fabrication process of fabricating a substrate for an IC package, wherein the substrate employs a core layer and an adjacent insulation layer with an embedded metal structure positioned from the core layer to avoid electron migration including, but not limited to, the substrates in FIGS. 2 and 4;

FIGS. 8A-8H are exemplary fabrication stages during fabrication of the substrate according to the fabrication process in FIGS. 7A-7C;

FIGS. 9A-9D is a flowchart illustrating another exemplary fabrication process of fabricating a substrate for an IC package, wherein the substrate employs a core layer and an adjacent insulation layer with an embedded metal structure positioned from the core layer to avoid electron migration including, but not limited to, the substrates in FIGS. 3 and 5;

FIGS. 10A-10I are exemplary fabrication stages during fabrication of the substrate according to the fabrication process in FIGS. 9A-9D;

DETAILED DESCRIPTION

Figure 1:
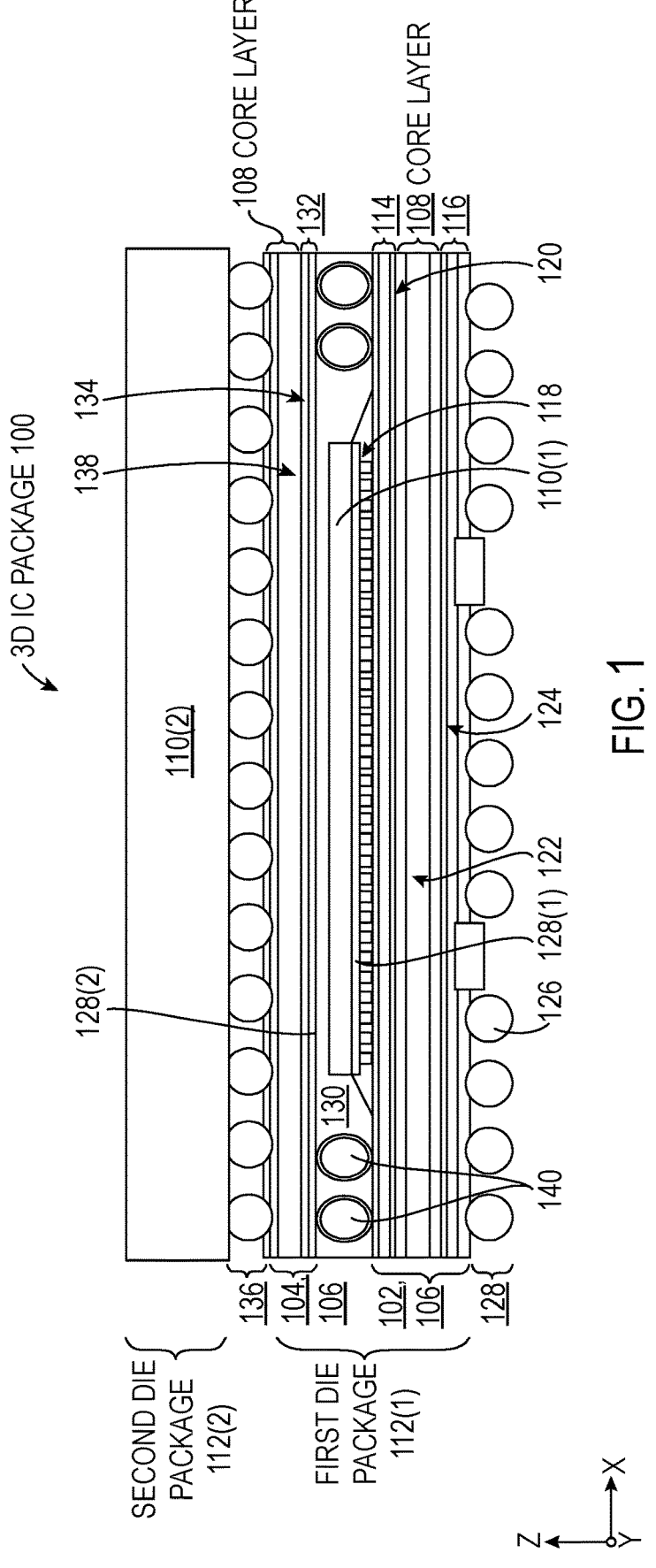
FIG. 1 is a side view of an exemplary three-dimensional (3D) integrated circuit (IC) (3DIC) package that includes a package substrate and interposer substrate that may employ a core layer and an adjacent insulation layer with an embedded metal structure(s) positioned from the core layer to avoid electron migration.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a substrate for an integrated circuit (IC) package employing a core layer and an adjacent insulation layer with an embedded metal structure(s) positioned from the core layer to avoid electron migration. The substrate includes a core layer and one or more metallization layers. The core layer provides stabilization to the substrate to reduce or avoid warpage. For example, the core layer may include a glass material weaved throughout the core to provide stabilization to the core layer and avoid warpage. In exemplary aspects disclosed herein, a metallization layer adjacent to the core layer in the substate includes an insulation layer and the embedded metal structure(s) that is positioned from the core layer. The thickness of the insulation layer is greater than the embedded metal structure so that a surface of the embedded metal structure is positioned at least at a length (l) from the surface of the glass material. This can avoid or reduce the risk of the embedded metal structure electrically shorting to another metal structure in the substrate through the core layer.

Additionally, in other exemplary aspects, in reducing the thickness of the core layer to meet today's overall package height requirements, shorter vias are formed through the core layer of the substrate to couple the embedded metal structure. The vias provide a pass through electrical connection through the core layer to adjacent metallization layers. To advantageously achieve a reliable via connection of the resulting shorter via, the embedded metal structure in the metallization layer can include two stacked metal structures forming a post. The post enables a drilled via (which may be formed by a drilling and metal fill process) to terminate within the two stacked metal structures and provide greater surface area connecting the inside of the two stacked metal structures and the via.

In this regard, FIG. 1 is a side view of an exemplary IC package 100, which in this example is a three-dimensional (3D) IC (3DIC) package 100. The IC package 100 includes a package substrate 102 and an interposer substrate 104. The package substrate 102 and the interposer substrate 104 commonly route signals and power and, for convenience, may both be referred to simply as a substrate 106. The substrate 106 employs a core layer and an adjacent insulation layer with an embedded metal structure(s) positioned from the core layer to avoid electron migration. Exemplary embodiments of the substrate 106 will be discussed in more detail in connection with the description of FIGS. 2-5 below.

In this example, the IC package 100 includes first and second dies 110(1), 110(2) that are included in respective first and second die packages 112(1), 112(2) that are stacked on top of each other in the vertical direction (Z-axis direction). The first die package 112(1) of the IC package 100 includes the first die 110(1) coupled to the package substrate 102. In this example, the package substrate 102 includes a first, upper metallization layer 114 disposed on a core layer 108. The core layer 108 is a central layer of a substrate that provides mechanical strength to the IC package 100. The core layer 108 is typically made of a strong dielectric material such as glass. The core layer 108 is disposed on a second, bottom metallization layer 116. The first, upper metallization layer 114 provides an electrical interface for signal routing to the first die 110(1). The first die 110(1) is coupled to die interconnects 118 (e.g., raised metal bumps) that are electrically coupled to metal interconnects 120 in the first, upper metallization layer 114. The metal interconnects 120 in the first, upper metallization layer 114 are coupled to metal vias 122 (not visible) in the core layer 108, which are coupled to metal interconnects 124 in the second, bottom metallization layer 116. In this manner, the package substrate 102 provides interconnections between its first and second metallization layers 114, 116, and core layer 108 to provide signal routing to the first die 110(1). External interconnects 126 (e.g., ball grid array (BGA) interconnects) are coupled to the metal interconnects 124 in the second, bottom metallization layer 116 to provide interconnections through the package substrate 102 to the first die 110(1) through the die interconnects 118. In this example, a first, active side 128(1) of the first die 110(1) is adjacent to and coupled to the package substrate 102, and more specifically the first, upper metallization layer 114 of the package substrate 102.

In the exemplary IC package 100 in FIG. 1, an additional optional second die package 112(2) is provided and coupled to the first die package 112(1) to support multiple dies. For example, the first die 110(1) in the first die package 112(1) may include an application processor, and the second die 110(2) may be a memory die, such as a dynamic random access memory (DRAM) die that provides memory support for the application processor. In this regard, in this example, the first die package 112(1) also includes the interposer substrate 104 that is disposed on a package mold 130 encasing the first die 110(1), adjacent to a second, inactive side 128(2) of the first die 110(1). The interposer substrate 104 also includes a core layer 108 and one or more metallization layers 132 that each include metal interconnects 134 to provide interconnections to the second die 110(2) in the second die package 112(2). The second die package 112(2) is physically and electrically coupled to the first die package 112(1) by being coupled through external interconnects 136

(e.g., solder bumps, BGA interconnects) to the interposer substrate 104. The external interconnects 136 are coupled to the metal interconnects 134 in the interposer substrate 104 through metal vias 138 (not visible). The first die package 112(1) includes vertical interconnects 140 to couple the second die 110(2) to the external interconnects 126 and to first die 110(1) through the package substrate 102.

Figure 2:
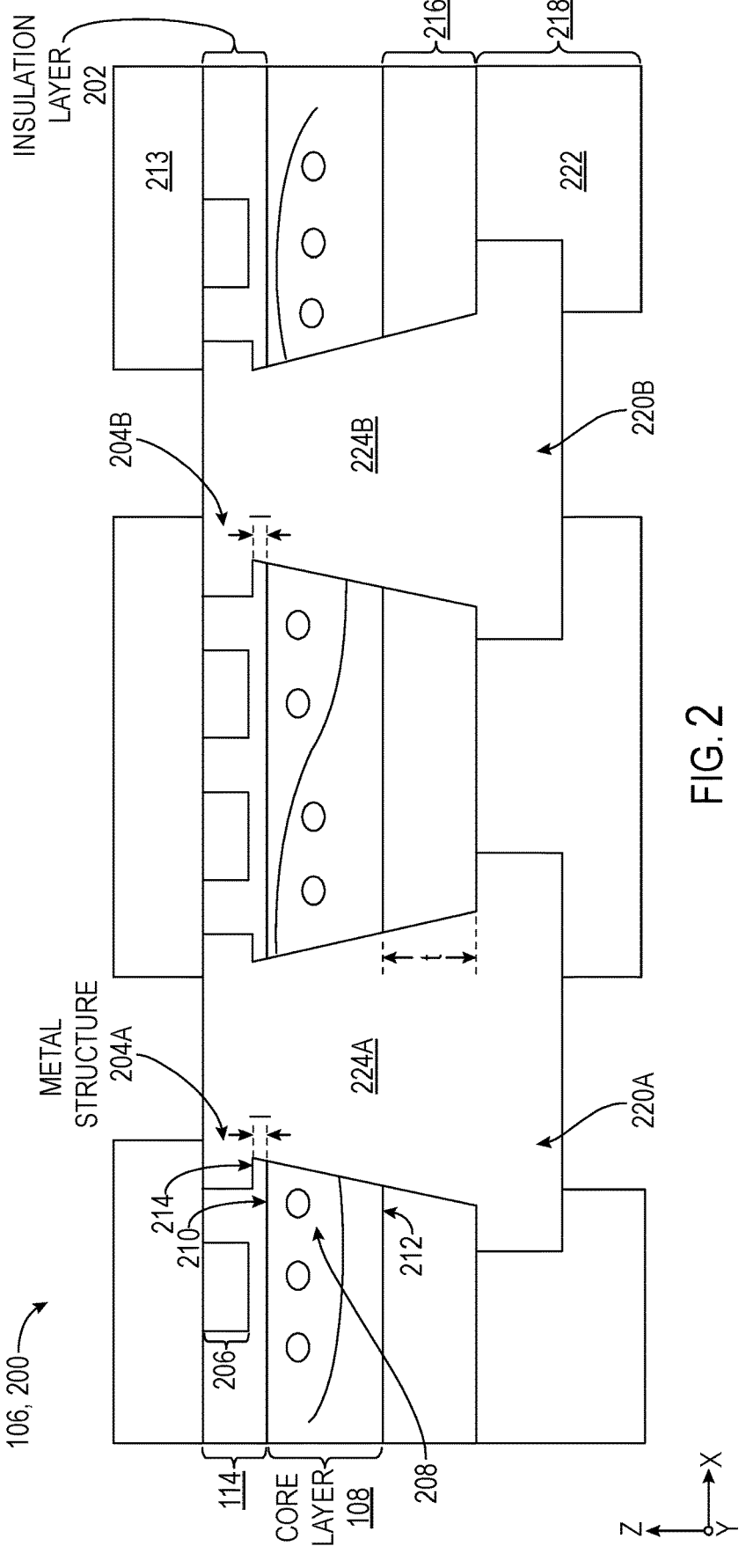
FIG. 2 is a side view of an exemplary substrate employing a core layer and an adjacent insulation layer with an embedded metal structure positioned from the core layer to avoid electron migration wherein the embedded metal structure is composed of a single metal layer.

FIG. 2 is a side view of a first exemplary embodiment of a substrate 106, 200 employing a core layer 108 and an adjacent insulation layer 202 with embedded metal structures 204A, 204B positioned from the core layer 108 to avoid electron migration wherein the embedded metal structures 204A, 204B are composed of a single metal layer 206. The embedded metal structures 204A, 204B are positioned at least a length, l, from the core layer 108. The length, l, is at least two micrometers (2 μm). The core layer 108 extends in a first, horizontal direction (X-axis direction) and comprises a glass material 208 weaved in the core layer 108. The core layer 108 includes a first surface 210 and a second surface 212 opposite the first surface 210 in a second, vertical direction (Z-axis) orthogonal to the first direction (X-axis). The first, upper metallization layer 114 is adjacent to the first surface 210 and comprises the insulation layer 202 and the metal structures 204A, 204B embedded in the insulation layer 202. Insulation layer 213 is above metallization layer 114 in the Z-direction. The metal structures 204A, 204B have a third surface 214 positioned at least the length (l) in the second, vertical direction (Z-axis) from the first surface 210 of the core layer 108. A lower insulation layer 216 is adjacent to the second surface 212 of the core layer 108 in the second, vertical direction (Z-axis). The insulation layer 202 and the lower insulation layer 216 have a coefficient of thermal expansion (CTE) that substantially matches the CTE of the core layer 108. The insulation layer 202 and the lower insulation layer 216 have a dielectric constant ($\kappa_{il}$) that substantially matches the dielectric constant ($\kappa_{cl}$) of the core layer 108. Alternative examples of the insulation layer 202 and/or the lower insulation layer 216 may include a resin material including, but not limited to, resin coated Cu foil (RCC), a photo imageable dielectric (PID), and an Ajinomoto Build-up Film® (ABF). For example, the core layer 108 may include a resin material with a glass material weaved in the resin material such as Samsung® GHPL-830NS prepreg material which has a dielectric constant ($\kappa_{cl}$) of 3.9 and a CTE of 14 and can be matched with RCC, such as Sumitomo® LaZ 7752 which has a dielectric constant ($\kappa_{il}$) of 4 and a CTE of 14. During the fabrication processes which will be described in connection with FIGS. 7A-7C and 9A-9D, the core layer 108 may be referred to as prepreg material (PPG).

A metallization layer 218 is adjacent to the lower insulation layer 216 in the second, vertical direction (Z-axis). The metallization layer 218 includes metal structures 220A and 220B and an insulation material 222. Metal vias 224A, 224B connect the metal structures 220A, 220B to the metal structures 204A, 204B, respectively. The thickness (t) of the lower insulation layer 216 prevents electron migration from the metal structures 220A. 220B through the core layer 108. The thickness (t) of the insulation layer 216 is preferably at least 20 μm and the thickness of metal structures 220A, 220B are generally 14 μm. As mentioned above, the length (l) from the first surface 210 of the core layer 108 and the third surface 214 of the metal structures 204A, 204B prevents electron migration between metal structures in the metallization layer 114 through the core layer 108. In other words, metal structures in the metallization layer 114 will not be electrically shorted through the core layer 108.

Figure 3:
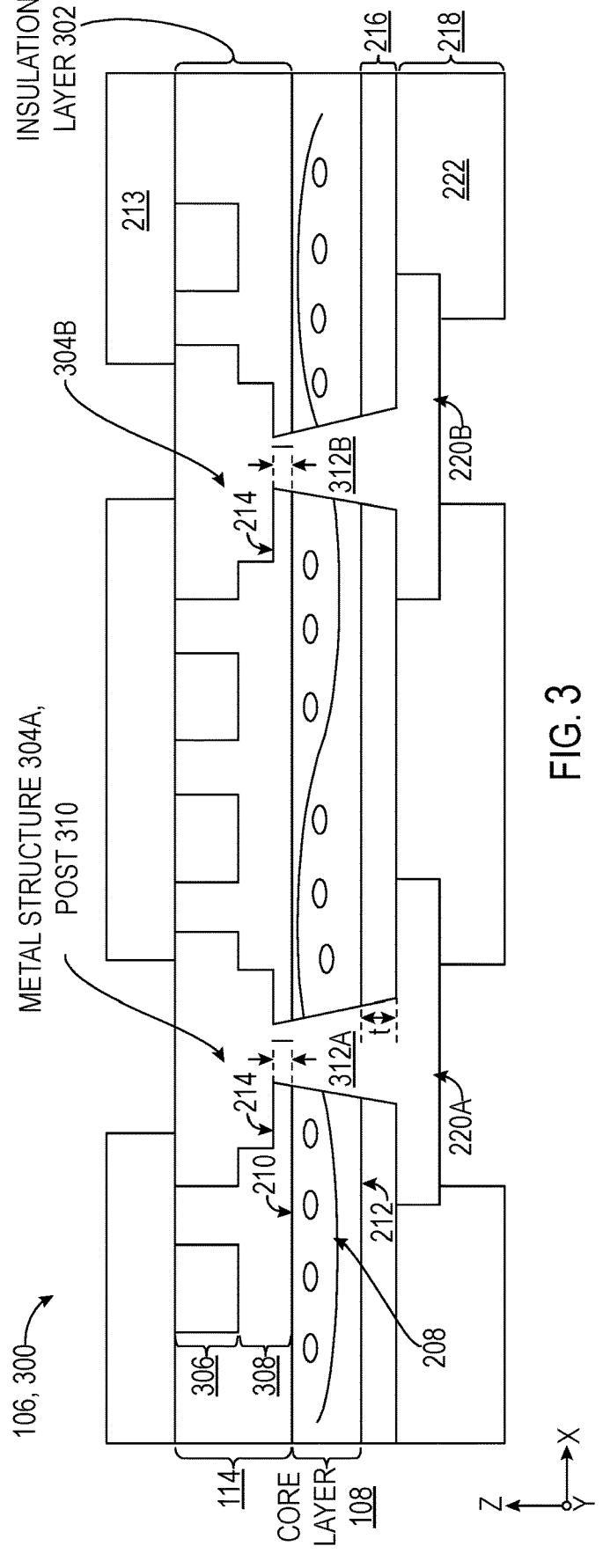
FIG. 3 is a side view of another exemplary substrate employing a core layer and an adjacent insulation layer with an embedded metal structure positioned from the core layer to avoid electron migration wherein the embedded metal structure is composed of at least two metal layers forming a post.

FIG. 3 is a side view of another exemplary embodiment of a substrate 106, 300 employing a core layer 108 and an adjacent insulation layer 302 with embedded metal structures 304A, 304B positioned from the core layer 108 to avoid electron migration wherein the embedded metal structures 304A, 304B are composed of at least two metal layers, metal layer 306 and metal layer 308, forming a post 310. Common elements between the substrate 300 in FIG. 3 and elements of the substrate 200 in FIG. 2 are shown with common element numbers. The upper metallization layer 114 is adjacent to the first surface 210 and comprises the insulation layer 302 and the metal structures 304A, 304B embedded in the insulation layer 302. The metal structures 304A, 304B have a third surface 214 positioned at least a length (l) in the second, vertical direction (Z-axis) from the first surface 210 of the core layer 108. The insulation layer 302 and the lower insulation layer 216 have a CTE that substantially matches the CTE of the core layer 108. The insulation layer 302 and the lower insulation layer 216 have a dielectric constant ($\kappa_{il}$) that substantially matches the dielectric constant ($\kappa_{cl}$) of the core layer 108. Alternative examples of the insulation layer 302 may include a resin material including, but not limited to, resin coated Cu foil (RCC), a photo imageable dielectric (PID), and an Ajinomoto Build-up Film® (ABF). Metal vias 312A, 312B connect the metal structures 220A. 220B to the metal structures 304A, 304B, respectively.

Utilizing the post 310 in this embodiment facilitates the vias 312A, 312B to be shorter than the vias 224A, 224B in FIG. 2. However, without a separation of at least the length (l) as described herein between the third surface 214 of the post 310 and the first surface 210 of the core layer 108, electron migration between metal structure 304A and other metal structures through the core layer 108 would occur with higher probability than a single metal layer structure.

Figure 4:
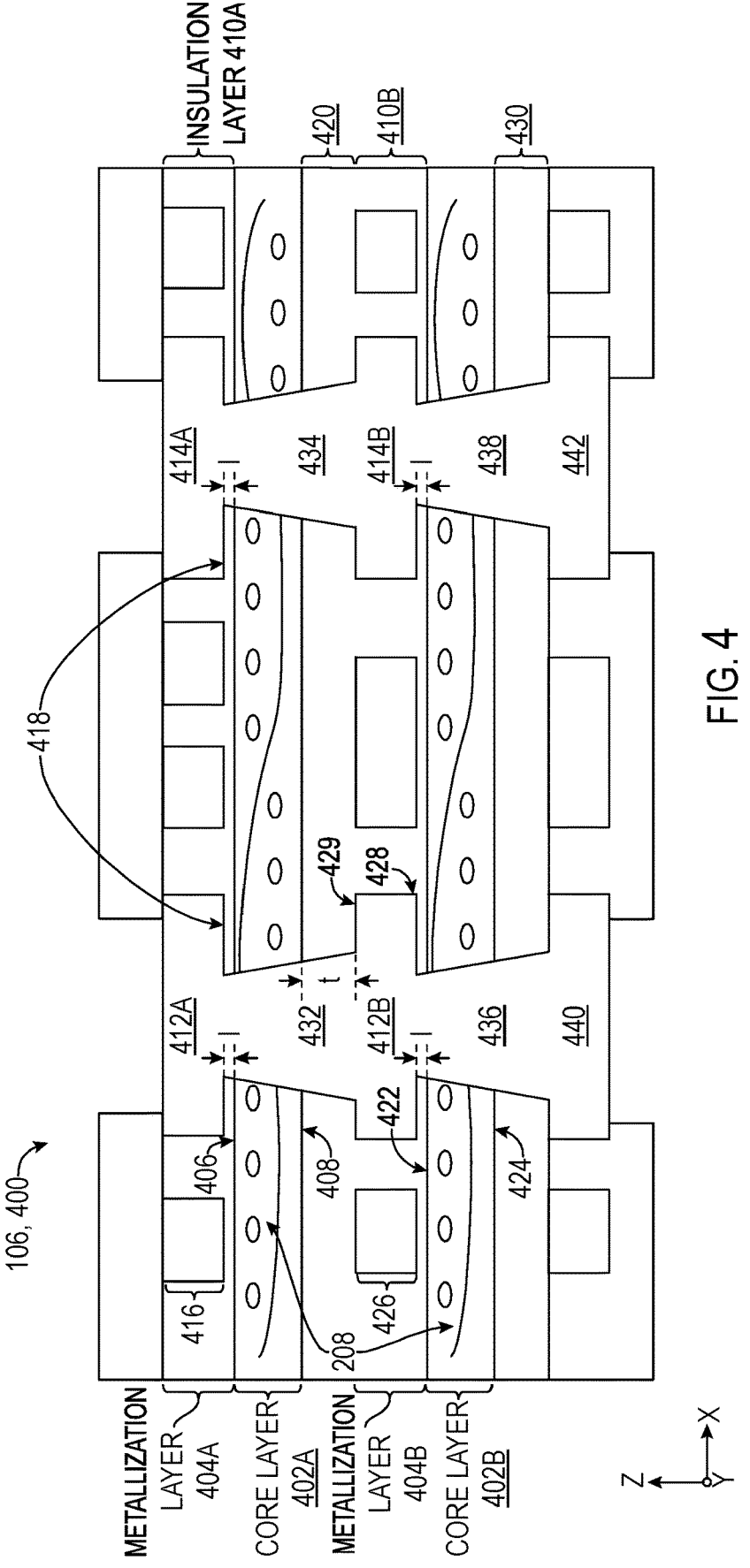
FIG. 4 is a side view of another exemplary substrate employing two core layers wherein each core layer includes an adjacent insulation layer with an embedded metal structure positioned from its respective core layer to avoid electron migration wherein the embedded metal structures are composed of a single metal layer.

FIG. 4 is a side view of another exemplary embodiment of a substrate 106, substrate 400 employing two core layers, core layer 402A and core layer 402B, wherein each core layer includes an adjacent insulation layer and an embedded metal structure positioned from its respective core layer to avoid electron migration wherein the embedded metal structures are composed of a single metal layer. The core layers 402A, 402B, like the core layer 108, are adjacent to metallization layers 404A, 404B, respectively.

The core layers 402A, 402B extend in a first, horizontal direction (X-axis direction) and comprise a glass material 208 in the core layers 402A and 402B. The core layer 402A includes a first surface 406 and a second surface 408 opposite the first surface 406 in a second, vertical direction (Z-axis) orthogonal to the first direction (X-axis). The metallization layer 404A is adjacent to the first surface 406 and comprises an insulation layer 410A and metal structures 412A, 414A embedded in the insulation layer 410A. The metal structures 412A, 414A are composed of a single metal layer 416 and have a third surface 418 positioned at least a length (l) in the second, vertical direction (Z-axis) from the first surface 406 of the core layer 402A. An insulation layer 420 is adjacent to the second surface 408 of the core layer 402A in the second, vertical direction (Z-axis).

The core layer 402B includes a fourth surface 422 and a fifth surface 424 opposite the fourth surface 422 in the second, vertical direction (Z-axis) orthogonal to the first direction (X-axis). The metallization layer 404B is adjacent to the fourth surface 422 and comprises an insulation layer 410B and metal structures 412B, 414B embedded in the insulation layer 410B. The metal structures 412B, 414B are composed of a single metal layer 426 and have a sixth surface 428 and a seventh surface 429. The sixth surface 428 is positioned at least a length (l) in the second, vertical direction (Z-axis) from the fourth surface 422 of the core layer 402B. The seventh surface 429 is positioned at least the thickness (t) of the insulation layer 420 in the second, vertical direction (Z-axis) from the second surface 408 of the core layer 402A. The thickness (t) is greater than the length (l). The minimum thickness (t) is 15 μm. An insulation layer 430 is adjacent to the fifth surface 424 of the core layer 402B in the second, vertical direction (Z-axis). A metal via 432 connects metal structure 412A with metal structure 412B through the core layer 402A. A metal via 434 connects metal structure 414A with metal structure 414B through the core layer 402A. A metal via 436 connects a metal structure 440 with metal structure 412B through the core layer 402B. A metal via 438 connects metal structure 442 with metal structure 414B through the core layer 402B.

The insulation layers 410A, 410B, 420, and 430 have a CTE that substantially matches the CTE of the core layers 402A and 402B. The insulation layers 410A, 410B. 420, and 430 have a dielectric constant ($\kappa_{il}$) that substantially matches the dielectric constant ($\kappa_{cl}$) of the core layers 402A and 402B.

Figure 5:
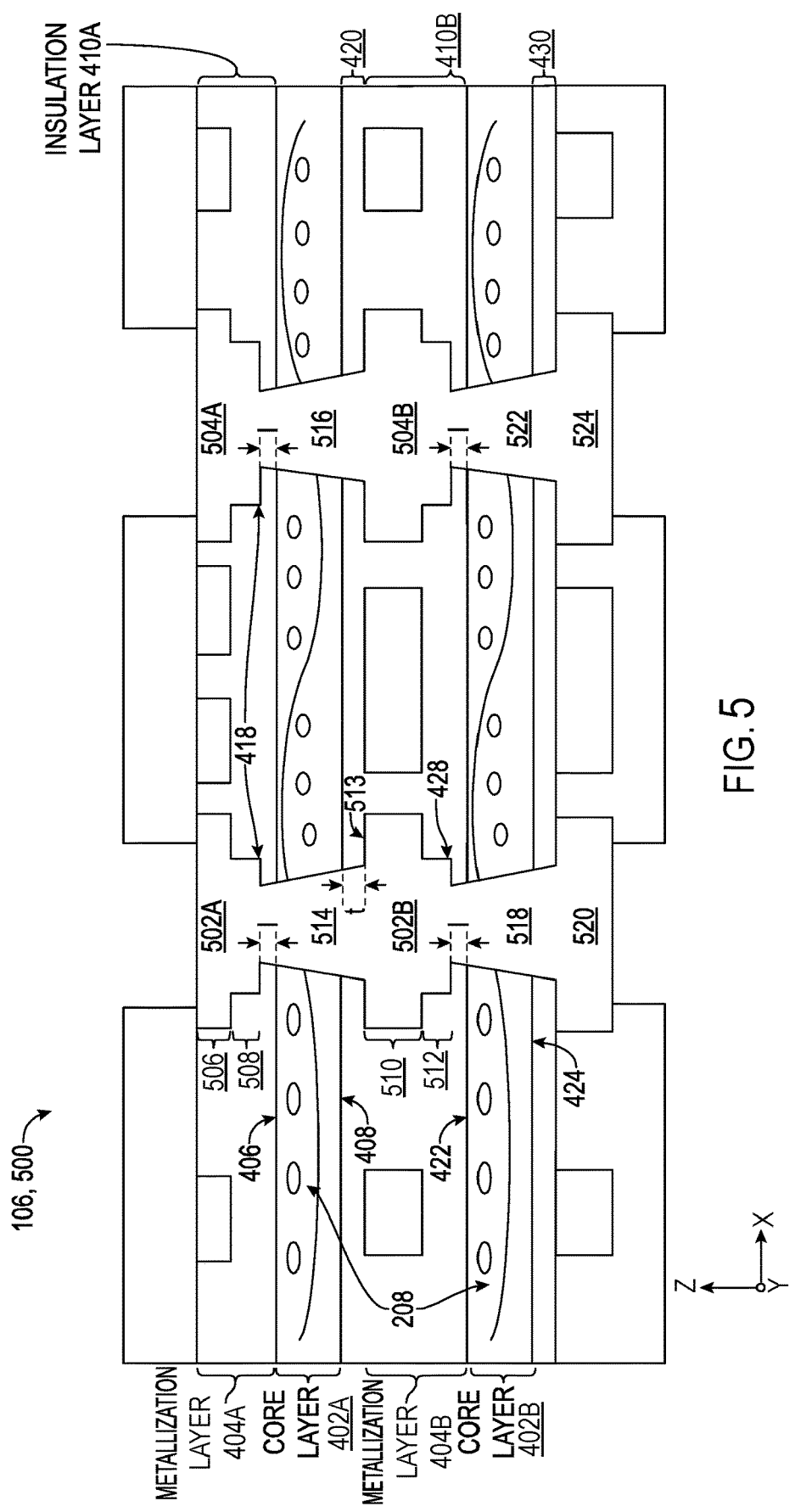
FIG. 5 is a side view of another exemplary substrate employing two core layers wherein each core layer includes an adjacent insulation layer with an embedded metal structure positioned from its respective core layer to avoid electron migration wherein the embedded metal structures are composed of at least two metal layers.

FIG. 5 is a side view of another exemplary embodiment of substrate 106, substrate 500 employing two core layers wherein each core layer includes an adjacent insulation layer with an embedded metal structure positioned from its respective core layer to avoid electron migration wherein the embedded metal structures are composed of at least two metal layers. Common elements between the substrate 500 in FIG. 5 and elements of the substrate 400 in FIG. 4 are shown with common element numbers. Core layers 402A, 402B, similar to the core layer 108, are adjacent to metallization layers 404A, 404B, respectively.

The core layers 402A, 402B extend in a first, horizontal direction (X-axis direction) and comprise a glass material 208 in the core layers 402A and 402B. The core layer 402A includes a first surface 406 and a second surface 408 opposite the first surface 406 in a second, vertical direction (Z-axis) orthogonal to the first direction (X-axis). The metallization layer 404A is adjacent to the first surface 406 and comprises an insulation layer 410A and metal structures 502A, 504A embedded in the insulation layer 410A. The metal structures 502A, 504A are composed of two metal layers, metal layer 506 and metal layer 508. The metal structures 502A, 504A, also known as posts, have a third surface 418 positioned at least a length (l) in the second, vertical direction (Z-axis) from the first surface 406 of the core layer 402A. An insulation layer 420 is adjacent to the second surface 408 of the core layer 402A in the second, vertical direction (Z-axis).

The core layer 402B includes a fourth surface 422 and a fifth surface 424 opposite the fourth surface 422 in the second, vertical direction (Z-axis) orthogonal to the first direction (X-axis). The metallization layer 404B is adjacent to the fourth surface 422 and comprises an insulation layer 410B and metal structures 502B, 504B embedded in the insulation layer 410B. The metal structures 502B, 504B, also known as posts, are composed of two metal layers, metal layer 510 and 512. Metal structure 502B has a sixth surface 428 and a seventh surface 513. The sixth surface 428 is positioned at least a length (l) in the second, vertical direction (Z-axis) from the fourth surface 422 of the core layer 402B. The seventh surface 513 is positioned at least the thickness (t) of the insulation layer 420 in the second, vertical direction (Z-axis) from the second surface 408 of the core layer 402A. The thickness (t) is greater than the length (l). The minimum thickness (t) is 15 μm. An insulation layer 430 is adjacent to the fifth surface 424 of the core layer 402B in the second, vertical direction (Z-axis). A metal via 514 connects metal structure 502A with metal structure 502B through the core layer 402A. A metal via 516 connects metal structure 504A with metal structure 504B through the core layer 402A. A metal via 518 connects a metal structure 520 with metal structure 502B through the core layer 402B. A metal via 522 connects a metal structure 524 with metal structure 504B through the core layer 402B.

The insulation layers 410A, 410B, 420, and 430 have a CTE that substantially matches the CTE of the core layers 402A and 402B. The insulation layers 410A, 410B, 420, and 430 have a dielectric constant $(\kappa_{il})$ that substantially matches the dielectric constant $(\kappa_{cl})$ of the core layers 402A and 402B.

A substrate employing a core layer and an adjacent insulation layer with an embedded metal structure positioned from the core layer to avoid electron migration, including, but not limited to, the substrates 200, 300, 400, and 500 in FIGS. 2-5 in the related IC package 100 in FIG. 1 can be fabricated by different fabrication processes. FIG. 6 is a flowchart illustrating an exemplary fabrication process 600 of fabricating a substrate such the substrates 200, 300, 400, and 500 in the related IC package 100 in FIG. 1, wherein the substrate employs a core layer and an adjacent insulation layer with an embedded metal structure positioned from the core layer to avoid electron migration, including, but not limited to, the substrates in FIGS. 2-5.

In this regard, a first exemplary step in the fabrication process 600 of FIG. 6 can include forming a first core layer 108, 402A. The first core layer 108, 402A comprises a glass material 208, a first surface 210, 406, and a second surface 212, 408 opposite the first surface in a second direction orthogonal to the first direction (block 602 in FIG. 6). A next step in the fabrication process 600 can include forming a first metallization layer 114, 404A adjacent to the first surface 210, 406. The first metallization layer 114, 404A comprises a first insulation layer 202, 302, 410A and a first metal structure 204A, 204B. 304A, 304B, 310, 412A, 414A, 502A, 504A embedded in the first insulation layer 202, 302, 410A (block 604 in FIG. 6). A next step in the fabrication process 600 can include coupling the first metallization layer 114, 404A to the first core layer 108, 402A, the first metal structure 204A, 204B, 304A, 304B, 310, 412A, 414A, 502A, 504A having a third surface 214, 418, the third surface 214, 418 positioned at least a length (l) in the second direction from the first surface 210, 406 of the first core layer 108, 402A (block 606 in FIG. 6).

Figures 7A, 8A, 8B:
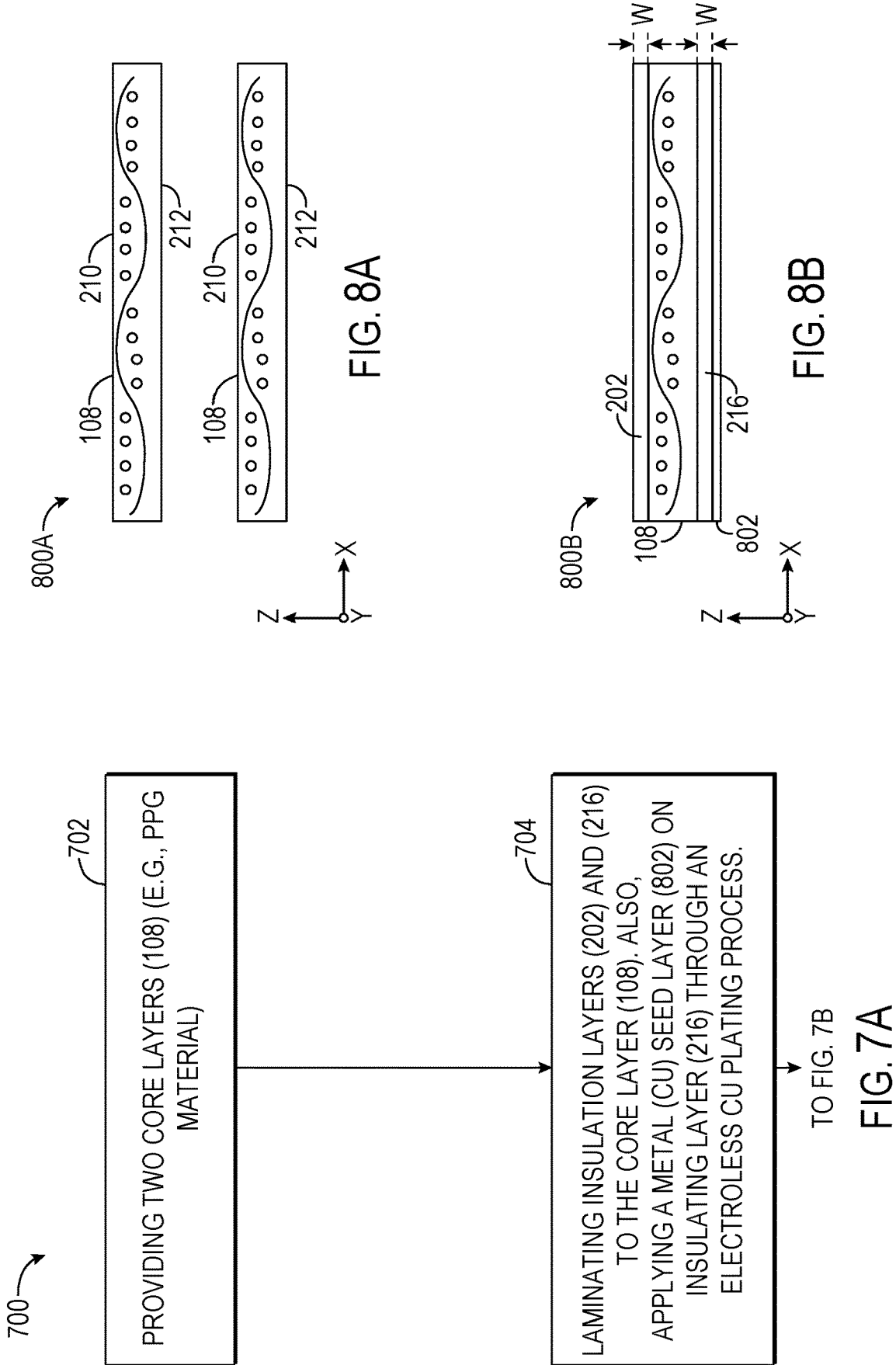
Figures 7C, 8F, 8G, 8H:
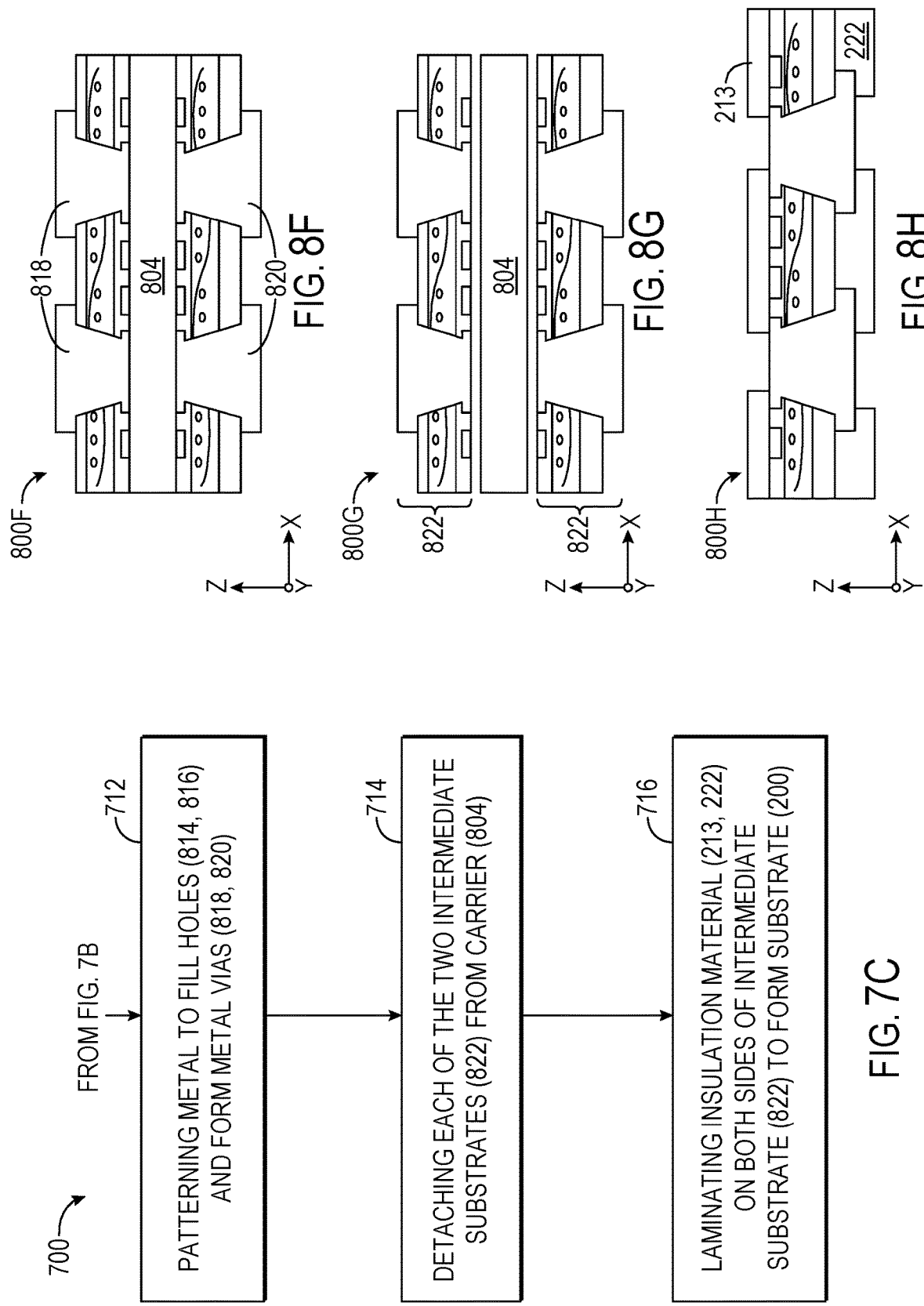

Other fabrication processes can also be employed to fabricate a substrate employing a core layer and an adjacent insulation layer with an embedded metal structure positioned from the core layer to avoid electron migration, including, but not limited to, the substrates 200, 300, 400, and 500 in FIGS. 2-5 in the related IC package 100 in FIG. 1. In this regard, FIGS. 7A-7C are a flowchart illustrating another exemplary fabrication process 700 of fabricating a substrate which employs a core layer and an adjacent insulation layer with an embedded metal structure positioned from the core layer to avoid electron migration, including, but not limited to, the substrates 200, 400 in FIGS. 2 and 4. FIGS. 8A-8H are exemplary fabrication stages during fabrication of the substrate according to the fabrication process in FIGS. 7A-7C. The fabrication process 700 as shown in the fabrication stages 800A-800H in FIGS. 8A-8H are in reference to the substrate 200 in FIG. 2 and the related IC package 100 in FIG. 1, and thus will be discussed with reference to the substrate 200 and related IC package 100 in FIGS. 1 and 2. For economies of scale, the fabrication process 700 will be described when fabricating two individual substrates 200.

In this regard, as shown in fabrication stage 800A in FIG. 8A, an exemplary step in the fabrication process 700 is to provide two core layers 108 (e.g., PPG material) with a first surface 210 and a second surface 212 (block 702 in FIG. 7A). As shown at fabrication stage 800B in FIG. 8B, a next step in the fabrication process 700 can include laminating insulation layers 202 and 216 to each core layer 108. Additionally, the fabrication process 700 can include applying a metal (Cu) seed layer 802 on the insulating layer 216 through an electroless Cu plating process (block 704 in FIG. 7A). The insulation layers 202 and 216 will have a width (w). In parallel, the fabrication process 700 includes patterning a metal layer 206 on a carrier 804. As shown at fabrication stage 800C in FIG. 8C, an exemplary step in the fabrication process 700 is to pattern metal layers 206 on both a top surface 806 and a bottom surface 808 of the carrier 804 (block 706 in FIG. 7B). The patterned metal layers 206 have a height (h). The one metal layer 206 has a surface 810 and the other metal layer 206 has a surface 812. As shown at fabrication stage 800D in FIG. 8D, a next step in the fabrication process 700 can include laminating one intermediate substrate from fabrication stage 800B to the top surface 806 of the carrier 804 and the other intermediate substrate from fabrication stage 800B to the bottom surface 808 of the carrier 804 (block 708 in FIG. 7B). Regarding the metal seed layers 802, another alternative to applying the metal seed layers 802 at fabrication stage 800B is to apply the metal seed layers 802 after laminating the two intermediate substrates in fabrication stage 800D by dipping the laminated intermediate substrates in a water solution containing copper salts and a reducing agent such as formaldehyde. As shown at fabrication stage 800D, there is a distance, t, between the surface 810 of the one metal layer 206 and the surface 210 of the one core layer 108. Also, there is a distance, t, between the surface 812 of the other metal layer 206 and the surface 210 of the other core layer 108. As shown at fabrication stage 800E in FIG. 8E, a next step in the fabrication process 700 can include laser drilling holes 814 through the one core layer 108 to the surface 810 of the one metal layer 206 and laser drilling holes 816 through the other core layer 108 to the other surface 812 of the other metal layer 206 (block 710 in FIG. 7B).

As shown at fabrication stage 800F in FIG. 8F, a next step in the fabrication process 700 can include patterning metal to fill the holes 814 and 816 and form metal vias 818 and 820 (block 712 in FIG. 7C). Please note that seed layer 802 is removed during the patterning process. As shown at fabrication stage 800G in FIG. 8G, a next step in the fabrication process 700 can include detaching each of the two intermediate substrates 822 from the carrier 804 (block 714 in FIG. 7C). As shown at fabrication stage 800H in FIG. 8H, a next step in the fabrication process 700 can include laminating insulation material 222 on both sides of the intermediate substrate 822 to form substrate 200 (block 716 in FIG. 7C). Additionally, the two detached intermediate substrate 822 can be laminated together to form substrate 400.

Other fabrication processes can also be employed to fabricate a substrate employing a core layer and an adjacent insulation layer with an embedded metal structure positioned from the core layer to avoid electron migration, including, but not limited to, the substrates 200, 300, 400, and 500 in FIGS. 2-5 in the related IC package 100 in FIG. 1. In this regard, FIGS. 9A-9D are a flowchart illustrating another exemplary fabrication process 900 of fabricating a substrate which employs a core layer and an adjacent insulation layer with an embedded metal structure positioned from the core layer to avoid electron migration, including, but not limited to, the substrates 300, 500 in FIGS. 3 and 5. FIGS. 10A-10I are exemplary fabrication stages during fabrication of the substrate according to the fabrication process in FIGS. 9A-9D. The fabrication process 900 as shown in the fabrication stages 1000A-1000I in FIGS. 10A-10I are in reference to the substrate 300 in FIG. 3 and the related IC package 100 in FIG. 1, and thus will be discussed with reference to the substrate 300 and related IC package 100 in FIGS. 1 and 3. For economies of scale, the fabrication process 900 will be described when fabricating two individual substrates 300.

Figures 9A, 10A, 10B:
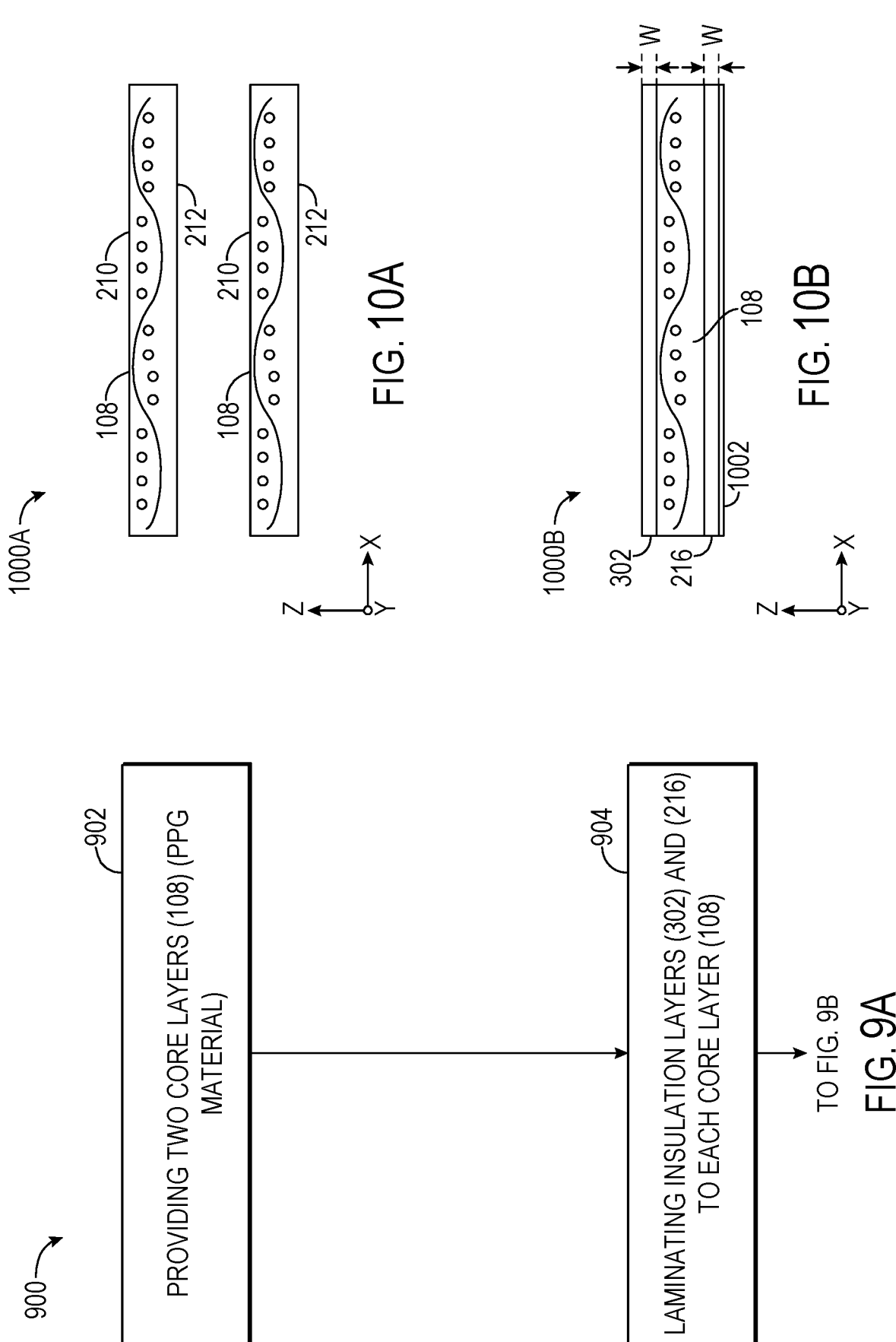

In this regard, as shown in fabrication stage 1000A in FIG. 10A, an exemplary step in the fabrication process 900 is to provide two core layers 108 (e.g., PPG material) with a first surface 210 and a second surface 212 (block 902 in FIG. 9A). As shown at fabrication stage 1000B in FIG. 10B, a next step in the fabrication process 900 can include laminating insulation layers 302 and 216 to each core layer 108. Additionally, the fabrication process 900 can include applying a metal (Cu) seed layer 1002 on the insulating layer 216 through an electroless Cu plating process (block 904 in FIG. 9A). For simplicity, fabrication stage 1000B shows one core layer 108. The insulation layers 302 and 216 will have a width (w).

In parallel, the fabrication process 900 includes patterning a metal layer 306 on a carrier 1004. As shown at fabrication stage 1000C in FIG. 10C, an exemplary step in the fabrication process 900 can include patterning metal layers 306 on both a top surface 1006 and bottom surface 1008 of the carrier 1004 (block 906 in FIG. 9B). The patterned metal layers 306 have a height, h1. The one metal layer 306 has a surface 1010 and the other metal layer 306 has a surface 1012. As shown at fabrication stage 1000D in FIG. 10D, a next step in the fabrication process 900 can include plating a second metal layer 308 on the surface 1010 of the one metal layer 306 and a second metal layer 308 on the surface 1012 of the other metal layer 306 (block 908 in FIG. 9B). The second metal layer 308 has a surface 214.

As shown at fabrication stage 1000E in FIG. 10E, a next step in the fabrication process 900 can include laminating one intermediate substrate from fabrication stage 1000B to the top surface 1006 of the carrier 1004 and the other intermediate substrate from fabrication stage 1000B to the bottom surface 1008 of the carrier 1004 (block 910 in FIG. 9B). Regarding the metal seed layers 1002, another alternative is applying the metal seed layer 1002 at fabrication stage 1000B is to apply the metal seed layers 1002 after laminating the two intermediate substrates in fabrication stage 1000D by dipping the laminated two intermediate substrates in a water solution containing copper salts and a reducing agent such as formaldehyde. As shown at fabrication stage 1000E, there is a distance, t, between the surface 214 of the one metal layer 308 and the surface 210 of the one core layer 108. Also, there is a distance, t, between the surface 214 of the other metal layer 306 and the surface 210 of the other core layer 108. As shown at fabrication stage 1000F in FIG. 10F, a next step in the fabrication process 900 can include laser drilling holes 1014 through the one core layer 108 to the one surface 214 of the metal layer 308 and laser drilling holes 1016 through the other core layer 108 to the other surface 214 of the other metal layer 308 (block 914 in FIG. 9C).

Figures 9C, 10F, 10G, 10H:
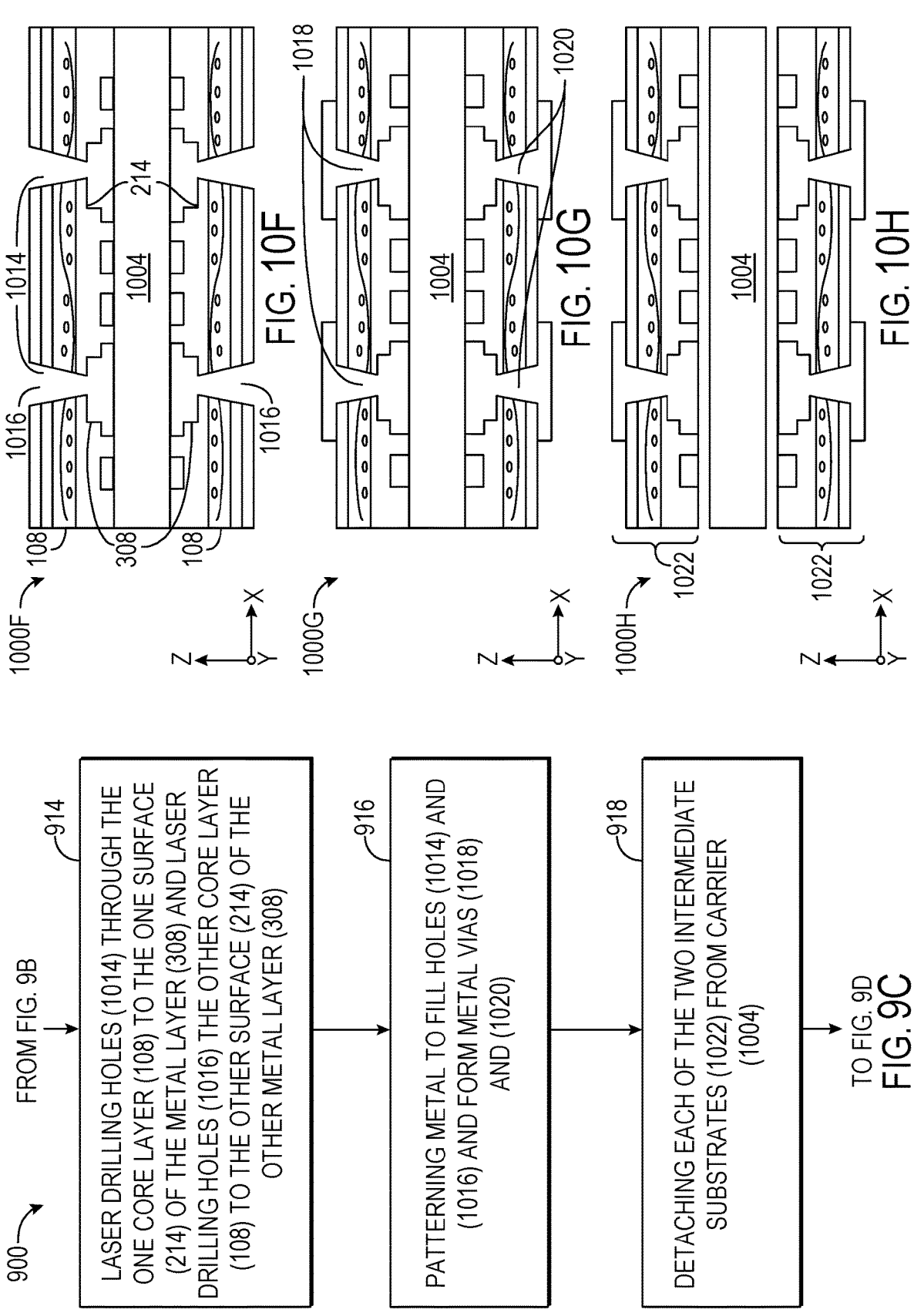
Figure 10I:
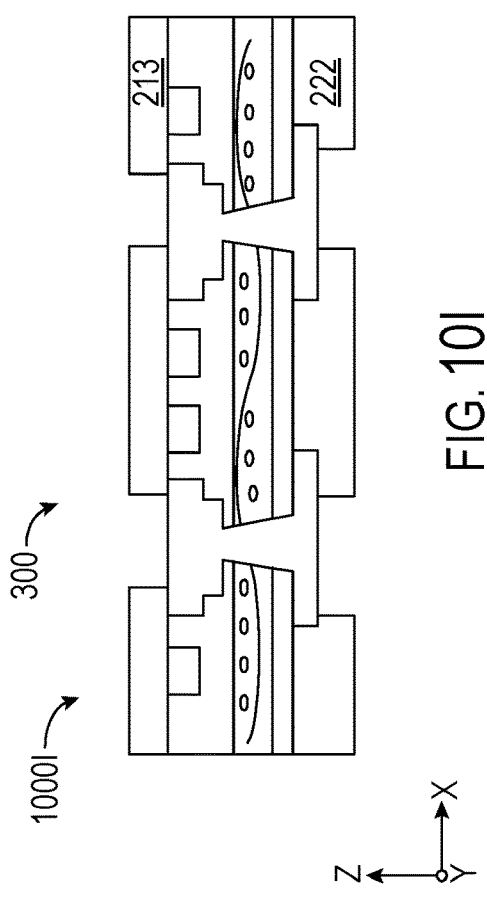
Figure 9D:

As shown at fabrication stage 1000G in FIG. 10G, a next step in the fabrication process 900 can include patterning metal to fill the holes 1014, 1016 and form metal vias 1018 and 1020 (block 916 in FIG. 9C). As shown at fabrication stage 1000H in FIG. 10H, a next step in the fabrication process 900 can include detaching each of the two intermediate substrates 1022 from the carrier 1004 (block 918 in FIG. 9C). As shown at fabrication stage 1000I in FIG. 10I, a next step in the fabrication process 900 can include laminating insulation material 222 on both sides of the intermediate substrate 1022 to form substrate 300 (block 920 in FIG. 9D). Additionally, the two detached intermediate substrates 1022 can be laminated together to form substrate 500.

The substrate for an IC package wherein such substrate employs a core layer and an adjacent insulation layer with an embedded metal structure positioned from the core layer to avoid electron migration in the substrate(s), including, but not limited to, substrates 200, 300, 400, and 500 in FIGS. 2-5, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics systems, a drone, and a multicopter.

Figure 11:
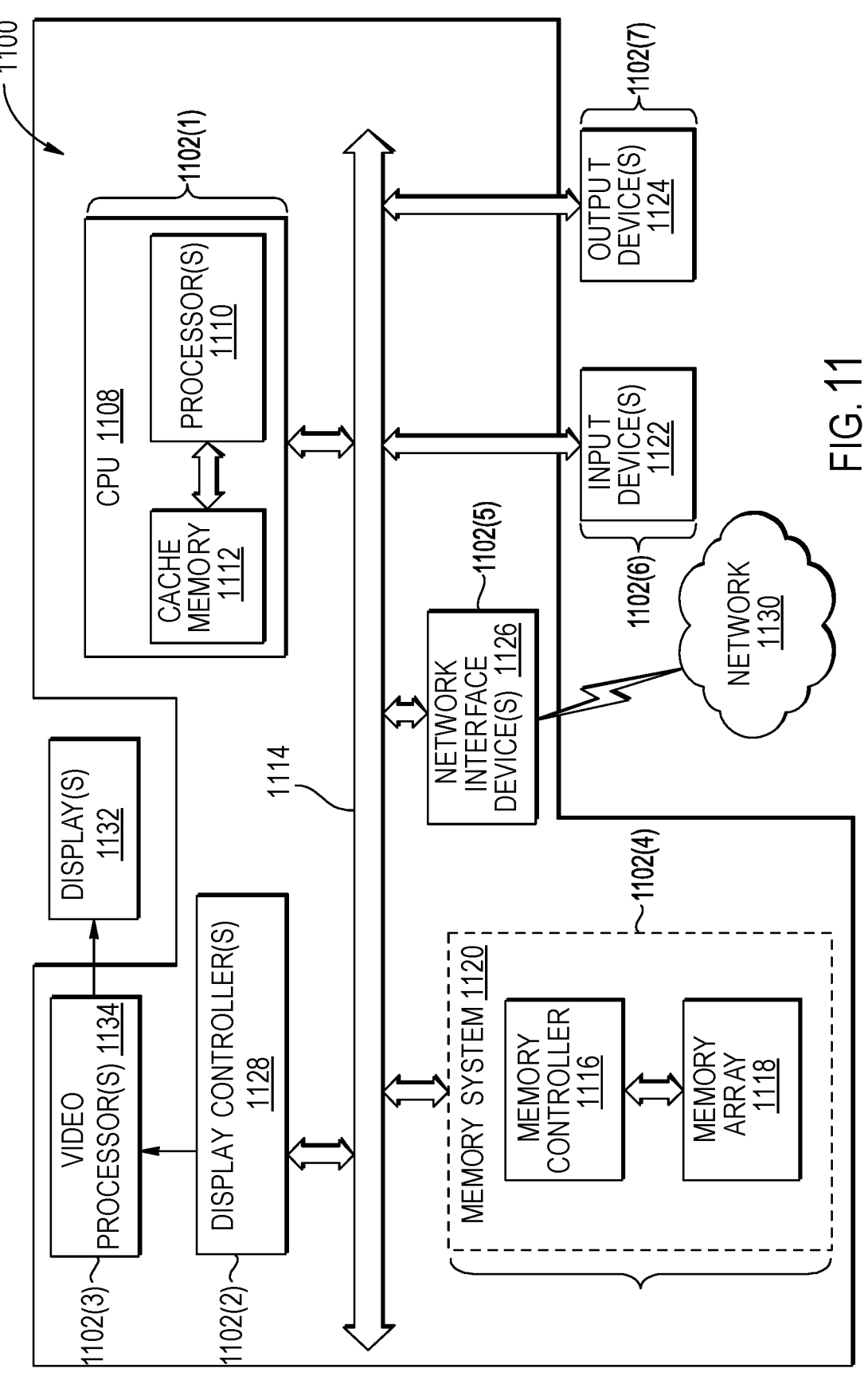
FIG. 11 is a block diagram of an exemplary processor-based system that can include components deployed in an IC package, wherein the IC package includes a substrate(s) employing a core layer and an adjacent insulation layer with an embedded metal structure positioned from the core layer to avoid electron migration in the substrate(s), including, but not limited to, the substrate(s) in FIGS. 1-5 and according to the exemplary fabrication processes in FIGS. 6-10I.

In this regard, FIG. 11 is a block diagram of an exemplary processor-based system 1100 that can include components deployed in an IC package, wherein the IC package includes a substrate(s) 1102(1)-1100(7) employing a core layer and an adjacent insulation layer with an embedded metal structure positioned from the core layer to avoid electron migration in the substrate(s), including, but not limited to, the substrate(s) 106, 200, 300, 400, and 500 in FIGS. 1-5 and according to the exemplary fabrication processes in FIGS. 6-10I. In this example, the processor-based system 1100 includes one or more central processing units (CPUs) 1108, each including one or more processors 1110. The CPU(s) 1108 may be a master device. The CPU(s) 1108 may have cache memory 1112 coupled to the processor(s) 1110 for rapid access to temporarily stored data. The CPU(s) 1108 is coupled to a system bus 1114 and can intercouple master and slave devices included in the processor-based system 1100. As is well known, the CPU(s) 1108 communicates with these other devices by exchanging address, control, and data information over the system bus 1114. For example, the CPU(s) 1108 can communicate bus transaction requests to a memory controller 1116 as an example of a slave device. Although not illustrated in FIG. 11, multiple system buses could be provided, wherein each system bus 1114 constitutes a different fabric.

Other master and slave devices can be connected to the system bus 1114. As illustrated in FIG. 11, these devices can include a memory system 1120, one or more input devices 1122, one or more output devices 1124, one or more network interface devices 1126, and one or more display controllers 1128, as examples. The input device(s) 1122 can include any type of input device, including, but not limited to, input keys, switches, voice processors, etc. The output device(s) 1124 can include any type of output device, including, but not limited to, audio, video, other visual indicators, etc. The network interface device(s) 1126 can be any devices configured to allow exchange of data to and from a network 1130. The network 1130 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1126 can be configured to support any type of communications protocol desired. The memory system 1120 can include one or more memory arrays 1118.

The CPU(s) 1108 may also be configured to access the display controller(s) 1128 over the system bus 1114 to control information sent to one or more displays 1132. The display controller(s) 1128 sends information to the display(s) 1132 to be displayed via one or more video processors 1134, which process the information to be displayed into a format suitable for the display(s) 1132. The display(s) 1132 can include any type of display, including, but not limited to, a cathode ray tube (CRT), a liquid crystal display (LCD), a plasma display, a light emitting diode (LED) display, etc.

Figure 12:
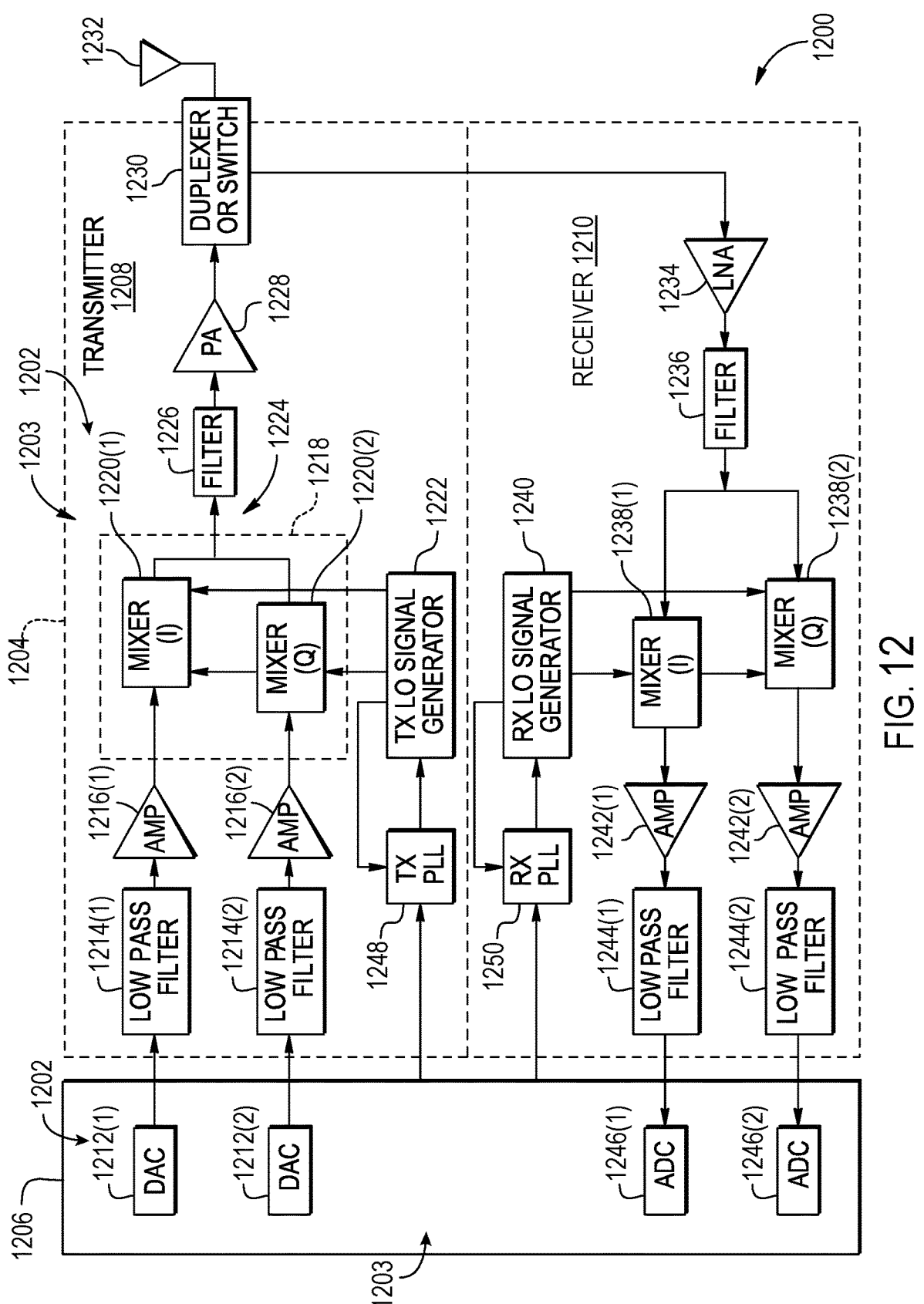
FIG. 12 is a block diagram of an exemplary wireless communications device that includes radio-frequency (RF) components deployed in an IC package, wherein the IC package includes a substrate(s) employing a core layer and an adjacent insulation layer with an embedded metal structure positioned from the core layer to avoid electron migration in the substrate(s), including, but not limited to, the substrate(s) in FIGS. 1-5, and according to the exemplary fabrication processes in FIGS. 6-10I.

FIG. 12 is a block diagram of an exemplary wireless communications device 1200 that includes radio-frequency (RF) components formed from one or more ICs 1202, wherein any of the ICs 1202 include a substrate(s) employing a core layer and an adjacent insulation layer with an embedded metal structure positioned from the core layer to avoid electron migration in the substrate(s), including, but not limited to, the substrate(s) 106, 200, 300, 400, and 500 in FIGS. 1-5, and according to the exemplary fabrication processes in FIGS. 6-10I, and according to any exemplary aspects disclosed herein.

The wireless communications device 1200 may include or be provided in any of the above-referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RFICs (RFICs), mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 1210. In the direct-conversion architecture, a signal is frequency-converted between RF and baseband in one stage. The super-heterodyne and direct-conversion architectures may use different circuit blocks and/or have different requirements. In the wireless communications device 1200 in Figure Y, the transmitter 1208 and the receiver 1210 are implemented with the direct-conversion architecture.

In the transmit path, the data processor 1206 processes data to be transmitted and provides 1 and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals (e.g., I and Q output currents) for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals through mixers 1220(1), 1220(2) from a TX LO signal generator 1222 to provide an upconverted signal 1224. A filter 1226 filters the upconverted signal 1224 to remove undesired signals caused by the frequency up-conversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency up-conversion, while the RX LO signal generator 1240 generates the I and Q RX LO signals used for frequency down-conversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Those of skill in the art will further appreciate that the various illustrative logical blocks, modules, circuits, and algorithms described in connection with the aspects disclosed herein may be implemented as electronic hardware, instructions stored in memory or in another computer readable medium wherein any such instructions are executed by a processor or other processing device, or combinations of both. The devices and components described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A substrate, comprising:
   a first core layer extending in a first direction comprising:
   a glass material;
   a first surface; and
   a second surface opposite the first surface in a second direction orthogonal to the first direction; and
   a first metallization layer adjacent to the first surface, the first metallization layer comprising:
   a first insulation layer; and
   a first metal structure embedded in the first insulation layer, the first metal structure having a third surface, the third surface positioned at least a length (l) in the second direction from the first surface of the first core layer.

2. The substrate of clause 1, wherein the first insulation layer has a coefficient of thermal expansion (CTE) that substantially matches a CTE of the first core layer.

3. The substrate of clause 1 or 2, wherein the first insulation layer has a first dielectric constant ($\kappa_{il}$) that substantially matches a second dielectric constant ($\kappa_{cl}$) of the first core layer.

4. The substrate of any of clauses 1-3, wherein the first metal structure comprises:
   a first metal layer; and
   a second metal layer adjacent to the first metal layer forming a post.

5. The substrate of any of clauses 1-4, wherein the first core layer further comprises a resin material.

6. The substrate of any of clauses 1-5, wherein the first insulation layer comprises a resin material.

7. The substrate of clause 6, wherein the resin material is selected from a group consisting of a resin coated Cu foil (RCC), a photo imageable dielectric (PID), and an Ajinomoto Build-up Film® (ABF).

8. The substrate of any of clauses 1-7, further comprising:
   a second insulation layer adjacent to the second surface;
   a second metallization layer adjacent to the second insulation layer; and
   a metal via connecting the second metallization layer to the first metal structure through the second insulation layer and the first core layer.

9. The substrate of clause 8, further comprising:
   a second core layer extending in the first direction, the second core layer comprising:
   a fourth surface; and
   a fifth surface, wherein the second metallization layer is adjacent to the fourth surface, the second metallization layer comprising:
   a third insulation layer; and
   a second metal structure embedded in the third insulation layer, the second metal structure having a sixth surface and a seventh surface, the sixth surface positioned at least a length (l) in the second direction from the fourth surface of the second core layer, the seventh surface positioned at least a thickness (t) in the second direction from the second surface of the first core layer.

10. The substrate of any of clauses 1-9 integrated into an integrated circuit (IC).

11. The substrate of any of clauses 1-10 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics systems; a drone; and a multicopter.

12. A method for fabricating a substrate, comprising:
  forming a first core layer extending in a first direction, the first core layer comprising:
    a glass material;
    a first surface; and
    a second surface opposite the first surface in a second direction orthogonal to the first direction;
  forming a first metallization layer adjacent to the first surface, the first metallization layer comprising:
    a first insulation layer; and
    a first metal structure embedded in the first insulation layer; and
  coupling the first metallization layer to the first core layer, the first metal structure having a third surface, the third surface positioned at least a length (l) in the second direction from the first surface of the first core layer.

13. The method of clause 12, wherein the first insulation layer has a coefficient of thermal expansion (CTE) that substantially matches a CTE of the first core layer.

14. The method of clause 12 or 13, wherein the first insulation layer has a first dielectric constant $(\kappa_{il})$ that substantially matches a second dielectric constant $(\kappa_{cl})$ of the first core layer.

15. The method of any of clauses 12-14, wherein the first metal structure comprises:
    a first metal layer; and
    a second metal layer adjacent to the first metal layer forming a post.

16. The method of any of clauses 12-15, wherein the first core layer further comprises a resin material.

17. The method of any of clauses 12-16, wherein the first insulation layer comprises a resin material.

18. The method of clause 17, wherein the resin material is selected from a group consisting of a resin coated Cu foil (RCC), a photo imageable dielectric (PID), and an Ajinomoto Build-up Film® (ABF).

19. The method of any of clauses 12-18, further comprising:
    forming a second insulation layer adjacent to the second surface of the first core layer;
    forming a second metallization layer adjacent to the second insulation layer; and coupling a metal via between the second metallization layer to the first metal structure through the second insulation layer and the first core layer.

20. The method of clause 19, further comprising:
    forming a second core layer extending in the first direction, the second core layer comprising:
      a fourth surface; and
      a fifth surface, wherein the second metallization layer is adjacent to the fourth surface, the second metallization layer comprising:
        a third insulation layer; and
        a second metal structure embedded in the third insulation layer, the second metal structure having a sixth surface and a seventh surface, the sixth surface positioned at least a length (l) in the second direction from the fourth surface of the second core layer, the seventh surface positioned at least a thickness (t) in the second direction from the second surface of the first core layer.

What is claimed is:

1. A substrate, comprising:
  a first core layer extending in a first direction comprising:
    a glass material;
    a first surface; and
    a second surface opposite the first surface in a second direction orthogonal to the first direction;
  a first metallization layer adjacent to the first surface, the first metallization layer comprising:
    a first insulation layer; and
    a first metal structure embedded in the first insulation layer, the first metal structure having a third surface, the third surface positioned at least a length (l) in the second direction from the first surface of the first core layer;
  a second insulation layer adjacent to the second surface;
  a second metallization layer adjacent to the second insulation layer and comprising a second metal structure adjacent to the second insulation layer and positioned at least a length (t) in the second direction from the second surface of the first core layer; and
  a metal via connecting the second metal structure to the first metal structure through the first insulation layer, the second insulation layer, and the first core layer.

2. The substrate of claim 1, wherein the first insulation layer has a coefficient of thermal expansion (CTE) that substantially matches a CTE of the first core layer.

3. The substrate of claim 2, wherein the first insulation layer has a first dielectric constant $(\kappa_{il})$ that substantially matches a second dielectric constant $(\kappa_{cl})$ of the first core layer.

4. The substrate of claim 1, wherein the first metal structure comprises:
    a first metal layer; and
    a second metal layer adjacent to the first metal layer forming a post.

5. The substrate of claim 1, wherein the first core layer further comprises a resin material.

6. The substrate of claim 1, wherein the first insulation layer comprises a resin material.

7. The substrate of claim 6, wherein the resin material is selected from a group consisting of a resin coated Cu foil (RCC) and a photo imageable dielectric (PID).

8. The substrate of claim 1, further comprising:

a second core layer extending in the first direction, the second core layer comprising:

a fourth surface; and a fifth surface, wherein the second metallization layer is adjacent to the fourth surface, the second metallization layer comprising:

a third insulation layer; and a third metal structure embedded in the third insulation layer, the third metal structure having a sixth surface and a seventh surface, the sixth surface positioned at least a length (l) in the second direction from the fourth surface of the second core layer, the seventh surface positioned at least a thickness (t) in the second direction from the second surface of the first core layer.

9. The substrate of claim 1 integrated into an integrated circuit (IC).

10. The substrate of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics systems; a drone; and a multicopter.

11. A method for fabricating a substrate, comprising:

forming a first core layer extending in a first direction, the first core layer comprising:

a glass material;

a first surface; and a second surface opposite the first surface in a second direction orthogonal to the first direction;

forming a first metallization layer adjacent to the first surface, the first metallization layer comprising:

a first insulation layer; and a first metal structure embedded in the first insulation layer;

coupling the first metallization layer to the first core layer, the first metal structure having a third surface, the third surface positioned at least a length (l) in the second direction from the first surface of the first core layer;

forming a second insulation layer adjacent to the second surface of the first core layer;

forming a second metallization layer adjacent to the second insulation layer and comprising a second metal structure adjacent to the second insulation layer and positioned at least a length (t) in the second direction from the second surface of the first core layer; and coupling a metal via between the second metal structure to the first metal structure through the first insulation layer, the second insulation layer, and the first core layer.

12. The method of claim 11, wherein the first insulation layer has a coefficient of thermal expansion (CTE) that substantially matches a CTE of the first core layer.

13. The method of claim 12, wherein the first insulation layer has a first dielectric constant ($K_{il}$) that substantially matches a second dielectric constant ($\kappa_{cl}$) of the first core layer.

14. The method of claim 11, wherein the first metal structure comprises:

a first metal layer; and a second metal layer adjacent to the first metal layer forming a post.

15. The method of claim 11, wherein the first core layer further comprises a resin material.

16. The method of claim 11, wherein the first insulation layer comprises a resin material.

17. The method of claim 16, wherein the resin material is selected from a group consisting of a resin coated Cu foil (RCC) and a photo imageable dielectric (PID).

18. The method of claim 11, further comprising:

forming a second core layer extending in the first direction, the second core layer comprising:

a fourth surface; and a fifth surface, wherein the second metallization layer is adjacent to the fourth surface, the second metallization layer comprising:

a third insulation layer; and a third metal structure embedded in the third insulation layer, the third metal structure having a sixth surface and a seventh surface, the sixth surface positioned at least a length (l) in the second direction from the fourth surface of the second core layer, the seventh surface positioned at least a thickness (t) in the second direction from the second surface of the first core layer.

* * * * *